(12) United States Patent
Chauhan et al.

(10) Patent No.: US 9,391,027 B2
(45) Date of Patent: Jul. 12, 2016

(54) EMBEDDED SEMICONDUCTOR DEVICE PACKAGE AND METHOD OF MANUFACTURING THEREOF

(71) Applicant: General Electric Company, Schenectady, NY (US)

(72) Inventors: Shakti Singh Chauhan, Niskayuna, NY (US); Paul Alan McConnelee, Albany, NY (US); Arun Virupaksha Gowda, Rexford, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 14/844,515

(22) Filed: Sep. 3, 2015

(65) Prior Publication Data

US 2015/0380356 A1   Dec. 31, 2015

Related U.S. Application Data

(63) Continuation of application No. 14/037,728, filed on Sep. 26, 2013, now Pat. No. 9,209,151.

(51) Int. Cl.
   *H01L 23/48* (2006.01)
   *H01L 23/52* (2006.01)
   (Continued)

(52) U.S. Cl.
   CPC ............ *H01L 23/5389* (2013.01); *H01L 23/34* (2013.01); *H01L 23/367* (2013.01);
   (Continued)

(58) Field of Classification Search
   USPC ................. 257/678–733, 787–796, 257/E23.001–E23.194, E21.499–E21.519, 257/7, 93, 334, 368, 427, 444, 446, 491, 257/E29.315–E29.316, E21.409–E21.449, 257/E21.334–E21.346, E21.473, 257/E21.575–E21.597, E21.627, E21.641, 257/E21.54–E21.574, E21.628, E21.642, 257/E21.567–E21.565; 438/221–224, 296, 438/359–361, 48–98, 135, 151, 197, 199, 438/201, 207, 216, 218, 294, 400–454
   See application file for complete search history.

(56) References Cited

U.S. PATENT DOCUMENTS

| | | | |
|---|---|---|---|
| 5,353,498 | A | 10/1994 | Fillion et al. |
| 6,232,151 | B1 | 5/2001 | Ozmat et al. |

(Continued)

OTHER PUBLICATIONS

Charboneau, "Double-Sided Liquid Cooling for Power Semiconductor Devices Using Embedded Power Technology", MS Thesis Virginia Polytechnic Institute, Jul. 22, 2005, pp. i-xii, pp. 1-85.

(Continued)

*Primary Examiner* — Dao H Nguyen
*Assistant Examiner* — Tram H Nguyen
(74) *Attorney, Agent, or Firm* — Ziolkowski Patent Solutions Group, SC; Jean K. Testa (57) ABSTRACT

A package structure includes a dielectric layer, at least one semiconductor device attached to the dielectric layer, one or more dielectric sheets applied to the dielectric layer and about the semiconductor device(s) to embed the semiconductor device(s) therein, and a plurality of vias formed to the semiconductor device(s) that are formed in at least one of the dielectric layer and the one or more dielectric sheets. The package structure also includes metal interconnects formed in the vias and on one or more outward facing surfaces of the package structure to form electrical interconnections to the semiconductor device(s). The dielectric layer is composed of a material that does not flow during a lamination process and each of the one or more dielectric sheets is composed of a curable material configured to melt and flow when cured during the lamination process so as to fill-in any air gaps around the semiconductor device(s).

19 Claims, 9 Drawing Sheets

(51) Int. Cl.
  *H01L 29/40*       (2006.01)
  *H01L 23/538*      (2006.01)
  *H01L 23/00*       (2006.01)
  *H05K 1/18*        (2006.01)
  *H01L 23/34*       (2006.01)
  *H01L 23/367*      (2006.01)
  *H01L 23/373*      (2006.01)
  *H01L 23/522*      (2006.01)
  *H01L 23/528*      (2006.01)
  *H01L 23/532*      (2006.01)
  *H05K 3/46*        (2006.01)
  *H05K 1/02*        (2006.01)
  *H05K 3/30*        (2006.01)
  *H01L 23/42*       (2006.01)
  *H01L 23/433*      (2006.01)

(52) U.S. Cl.
  CPC ........ *H01L23/3677* (2013.01); *H01L 23/3736* (2013.01); *H01L 23/528* (2013.01); *H01L 23/5226* (2013.01); *H01L 23/5386* (2013.01); *H01L 23/53228* (2013.01); *H01L 23/53295* (2013.01); *H01L 24/24* (2013.01); *H01L 24/25* (2013.01); *H01L 24/26* (2013.01); *H01L 24/32* (2013.01); *H01L 24/82* (2013.01); *H05K 1/185* (2013.01); *H01L 23/42* (2013.01); *H01L 23/433* (2013.01); *H01L 23/5384* (2013.01); *H01L 2224/04105* (2013.01); *H01L 2224/12105* (2013.01); *H01L 2224/2402* (2013.01); *H01L 2224/24137* (2013.01); *H01L 2224/24195* (2013.01); *H01L 2224/24225* (2013.01); *H01L 2224/2518* (2013.01); *H01L 2224/2732* (2013.01); *H01L 2224/27416* (2013.01); *H01L 2224/291* (2013.01); *H01L 2224/2919* (2013.01); *H01L 2224/32225* (2013.01); *H01L 2224/32245* (2013.01); *H01L 2224/73267* (2013.01); *H01L 2224/8201* (2013.01); *H01L 2224/82031* (2013.01); *H01L 2224/82039* (2013.01); *H01L 2224/82047* (2013.01); *H01L 2224/82101* (2013.01); *H01L 2224/83005* (2013.01); *H01L 2224/83132* (2013.01); *H01L 2224/83192* (2013.01); *H01L 2224/83855* (2013.01); *H01L 2224/92144* (2013.01); *H01L 2924/1203* (2013.01); *H01L 2924/12042* (2013.01); *H01L 2924/13091* (2013.01); *H01L 2924/1433* (2013.01); *H01L 2924/15747* (2013.01); *H01L 2924/15787* (2013.01); *H01L 2924/181* (2013.01); *H05K 1/0266* (2013.01); *H05K 3/305* (2013.01); *H05K 3/4602* (2013.01); *H05K 3/4605* (2013.01); *H05K 3/4688* (2013.01); *H05K 2201/0187* (2013.01); *H05K 2203/0278* (2013.01); *H05K 2203/063* (2013.01); *H05K 2203/166* (2013.01)

(56) References Cited

U.S. PATENT DOCUMENTS

| | | | |
|---|---|---|---|
| 6,306,680 | B1 | 10/2001 | Fillion et al. |
| 6,377,461 | B1 | 4/2002 | Ozmat et al. |
| 6,706,563 | B2 | 3/2004 | Shim et al. |
| 7,518,236 | B2 | 4/2009 | Delgado et al. |
| 8,097,936 | B2 | 1/2012 | Ewe et al. |
| 8,114,712 | B1 | 2/2012 | McConnelee et al. |
| 8,310,040 | B2 | 11/2012 | Beaupre et al. |
| 8,358,000 | B2 | 1/2013 | Beaupre et al. |
| 2002/0185718 | A1* | 12/2002 | Mikubo ............... H01L 23/433 257/678 |
| 2006/0124345 | A1* | 6/2006 | Asami ............... H01L 21/6835 174/250 |
| 2008/0190748 | A1 | 8/2008 | Arthur et al. |
| 2010/0019368 | A1* | 1/2010 | Shin .................. H01L 23/24 257/686 |
| 2011/0108971 | A1* | 5/2011 | Ewe .................. H01L 21/56 257/686 |
| 2011/0204505 | A1 | 8/2011 | Pagaila et al. |
| 2011/0266665 | A1 | 11/2011 | Gowda et al. |
| 2012/0133052 | A1* | 5/2012 | Kikuchi ........... H01L 23/49827 257/774 |
| 2012/0161325 | A1 | 6/2012 | McConnelee et al. |
| 2013/0009325 | A1 | 1/2013 | Mori et al. |

OTHER PUBLICATIONS

The EP Search Report and Written Opinion issued in connection with EP Application No. 14184831.7 on Jul. 8, 2015.

* cited by examiner

EMBEDDED SEMICONDUCTOR DEVICE PACKAGE AND METHOD OF MANUFACTURING THEREOF

CROSS-REFERENCE TO RELATED APPLICATION

The present application is a continuation of and claims priority to U.S. Non-Provisional patent application Ser. No. 14/037,728 filed Sep. 26, 2013, the disclosure of which is incorporated herein by reference in its entirety.

BACKGROUND OF THE INVENTION

Embodiments of the invention relate generally to structures and methods for packaging semiconductor devices and, more particularly, to an embedded package structure having power overlay (POL) interconnects that form all electrical and thermal interconnections in the package.

Surface-mount technology is a method for constructing electronic circuits in which surface mount components or packages are mounted directly onto the surface of printed circuit boards (PCBs) or other similar external circuits. In the industry, surface-mount technology has replaced the through-hole technology construction method of fitting components with wire leads into holes in the circuit board.

One common technique for surface-mounting a semiconductor device (or a multi-chip module) is to provide a package structure in which the device/module is encapsulated within an embedding compound. The package manufacturing process begins with placement of one or more semiconductor devices onto a dielectric layer by way of an adhesive, with the dielectric layer covering the active side of each semiconductor device. Metal interconnects are then electroplated onto the dielectric layer to form a direct metallic connection to the semiconductor device(s). The interconnects may be routed through additional laminate re-distribution layers, if desired, and an input/output system is provided to enable surface mounting of the package onto the PCB or external circuit. An embedding compound is applied about the semiconductor device(s) to encapsulate the semiconductor device(s) therein.

In an embodiment where the semiconductor device is a high voltage power semiconductor device, the power semiconductor device can be surface mounted to an external circuit by way of a power overlay (POL) packaging and interconnect system, with the POL package also providing a way to remove the heat generated by the device and protect the device from the external environment. A standard POL package manufacturing process typically begins with placement of one or more semiconductor devices onto a dielectric layer by way of an adhesive and drilling via holes though the dielectric to the devices. Metal interconnects (e.g., copper interconnects) are then electroplated onto the dielectric layer and into the vias to form a direct metallic connection to the semiconductor device(s), so as to form a sub-module. The metal interconnects may be in the form of a low profile, planar interconnect structure that provides for formation of an input/output (I/O) system to and from the semiconductor device(s). The POL sub-module is then soldered to a ceramic substrate (Alumina with DBC, AN with AMB Cu, etc.) using soldered interconnection for electrical and thermal connectivity. The gaps around the semiconductor device(s) between the dielectric layer and the ceramic substrate are then filled using a dielectric organic material using either capillary flow (capillary underfill), no-flow underfill or injection molding (molding compounds) to form the POL package.

With regard to the packaging manufacturing processes set forth above that embed semiconductor devices, modules, and/or power devices, it is recognized that numerous drawbacks are associated therewith. For example, the encapsulants and embedding compounds that are generally used have limited reliability when moisture sensitivity level (MSL)-qualification is required, due to their poor fracture toughness and high moisture uptake. Additionally, the encapsulants/embedding compounds typically used can be expensive to procure and slow and time consuming to apply.

Furthermore, and with particular regard to packaging power devices/modules, the soldering operation typically employed for electrically and thermally connecting the POL sub-module to the ceramic substrate can be costly and time consuming, with the additional temperature excursion required by soldering also adversely affecting module reliability. Still further, the inclusion of the ceramic substrate in the POL package places limits on an achievable reduction in size and thickness of the POL package (i.e., miniaturization) due to the size/thickness of the ceramic substrate. Thus, the desire to miniaturize modules to reduce system weight, cost and size while increasing electrical, thermal and mechanical performance is restrained by existing POL package structures.

Therefore, it would be desirable to provide a semiconductor device package structure that is surface mount compatible, and has a very low thickness. It would further be desirable for such a package structure to be manufactured at a reduced cost but increase system-level performance.

BRIEF DESCRIPTION OF THE INVENTION

Embodiments of the invention overcome the aforementioned drawbacks by providing a POL package structure having POL interconnects that form all electrical and thermal interconnections in the package.

In accordance with one aspect of the invention, a package structure includes a first dielectric layer, at least one semiconductor device attached to the first dielectric layer, one or more dielectric sheets applied to the first dielectric layer and about the at least one semiconductor device so as to embed the at least one semiconductor device therein, and a plurality of vias formed to the at least one semiconductor device, the plurality of vias formed in at least one of the first dielectric layer and the one or more dielectric sheets. The package structure also includes metal interconnects formed in the plurality of vias and on one or more outward facing surfaces of the package structure to form electrical interconnections to the at least one semiconductor device. The first dielectric layer is composed of a material that does not flow during a lamination process and each of the one or more dielectric sheets is composed of a curable material configured to melt and flow when cured during the lamination process, such that the one or more dielectric sheets melt and flow to fill-in any air gaps present around the at least one semiconductor device.

In accordance with another aspect of the invention, a method of manufacturing a semiconductor device package structure includes attaching at least one semiconductor device to a first dielectric layer by way of an adhesive, forming one or more dielectric sheets of a curable material configured to melt and flow when cured, with each of the dielectric sheets being in an uncured or partially cured state, applying the one or more dielectric sheets on the first dielectric layer so as to be positioned about the at least one semiconductor device, applying a copper foil on the outer surface of the last dielectric sheet, and curing the one or more dielectric sheets to cause the one or more dielectric sheets to melt and flow into any air gaps present around the at least one semiconductor device and so as to embed the at least one semiconductor device therein, wherein the first dielectric layer does not flow during the curing of the one or more dielectric sheets. The method also includes forming a plurality of vias to the at least one semiconductor device, the plurality of vias being formed in at least one of the first layer and the one or more dielectric sheets, and forming metallic interconnects in the plurality of vias and over at least a portion of one or more outer surfaces of the package structure, the metallic interconnects forming electrical interconnections to the at least one semiconductor device.

In accordance with yet another aspect of the invention, a POL package structure includes a first dielectric layer having an adhesive applied on at least a portion thereof, one or more semiconductor devices attached to the first dielectric layer by way of the adhesive with a surface of each of the one or more semiconductor devices having contact pads thereon being attached to the first dielectric layer, and a dielectric encapsulant positioned on the first dielectric layer about the one or more semiconductor devices so as to embed the one or more semiconductor devices therein, the dielectric encapsulant comprising one or more uncured or partially cured dielectric sheets configured to melt and flow when cured so as to fill-in any air gaps present around the one or more semiconductor devices. The POL package structure also includes a plurality of vias formed to the one or more semiconductor devices and in at least one of the first dielectric layer and the dielectric encapsulant and POL interconnects formed in the plurality of vias to form all electrical and thermal interconnections to the one or more semiconductor devices and in the POL package structure. The first dielectric is configured to not flow during the curing of the one or more dielectric sheets.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings.

DETAILED DESCRIPTION

Embodiments of the present invention provide for an embedded power module package structure having power overlay (POL) interconnects that form all electrical and thermal interconnections to the semiconductor devices in the power module, as well as a method of forming such a package structure.

Figure 1:
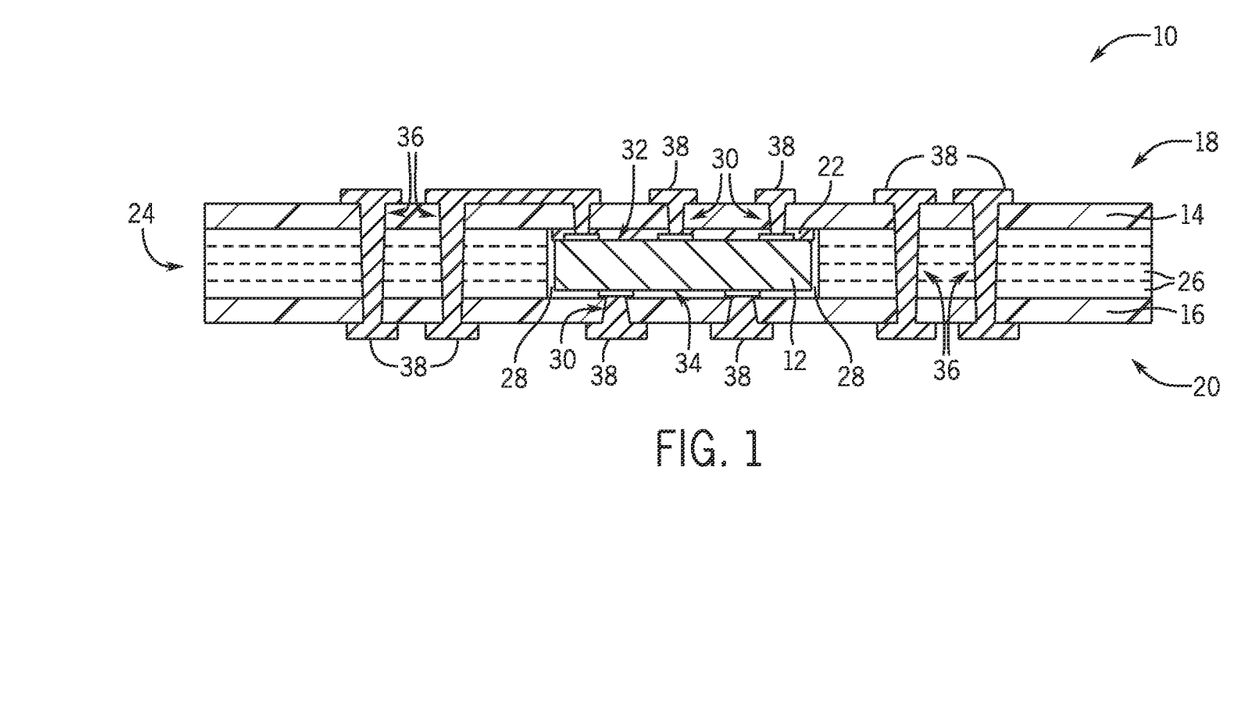
FIG. 1 is a schematic cross-sectional side view of a power overlay (POL) package structure according to an embodiment of the invention.

Referring to FIG. 1, a POL packaging and interconnect structure 10 is shown according to an embodiment of the invention. The package structure 10 includes a semiconductor device 12 that can be in the form of either what can generally be described as a "power device" or a "non-power device", and thus can be in the form of a die, diode, MOSFET, application specific integrated circuit (ASIC), or processor, for example. While a single semiconductor device 12 is shown in FIG. 1, it is recognized that additional semiconductor devices or electronic components could be included in the POL structure 10, as will be described below regarding another embodiment of the invention. The semiconductor device 12 is packaged within package structure 10 such that direct metallic interconnects form all electrical and/or thermal interconnections to the device.

As shown in FIG. 1, according to an exemplary embodiment, the package structure 10 includes a dielectric layer on each of opposing sides of the package structure 10 (with the semiconductor device 12 positioned therebetween), with the layers being generally referred to as a first dielectric layer 14 and a second dielectric layer 16. The dielectric layers 14, 16 are provided in the form of a lamination or film and are formed of a material that is chosen to provide mechanical and temperature stability to vias during use and frame processing, as well as provide suitable dielectric properties and voltage breakdown strength and processability for via formation and POL processing—and thus the dielectric layers 14, 16 can be referred to as a "POL dielectric." Additionally, the material from which dielectric layers 14, 16 is formed is chosen to remain stable during a lamination process performed on the package structure 10. That is, dielectric layers 14, 16 are formed of a suitable material such that they are configured to not flow during a lamination process performed on the package structure 10. Accordingly, the dielectric layers 14, 16 may be formed of one a plurality of dielectric materials, such as Kapton®, Ultem®, polytetrafluoroethylene (PTFE), Upilex®, polysulfone materials (e.g., Udel®, Radel®), or another polymer film, such as a liquid crystal polymer (LCP) or a polyimide material, according to embodiments of the invention. For purposes of clarity and distinguishing of the dielectric layers 14, 16 from other dielectric materials in the package structure 10, the dielectric layers 14, 16 are hereafter referred to as polyimide layers 14, 16, although this term is not meant to limit formation of the layers 14, 16 from a specific dielectric material.

As shown in FIG. 1, polyimide layers 14, 16 are provided on both sides of the package structure 10, i.e., on front and back surfaces 18, 20 of the package structure, so as to provide the ability to form vias and patterned metal interconnects on both surfaces, as will be explained further below. The semiconductor device 12 is positioned between the polyimide layers 14, 16, with the device 12 being attached to the polyimide layer 14 by way of an adhesive 22. Also included in package structure 10 is a dielectric encapsulant 24 (i.e., POL encapsulant) that is provided between the polyimide layers 14, 16. The encapsulant 24 serves to fill-up empty gaps within the package structure 10 that might be present around the semiconductor device 12 and between the polyimide layers 14, 16 and, according to one embodiment, may 'glue' the polyimide layer 14 to the device 12, and thus may be formed of one or more materials.

The encapsulant 24 is comprised of one or more dielectric layers 26 that are provided in a 'film' or 'panel' or 'sheet' form, such that, if required, multiple dielectric sheets 26 can be stacked on one another to a required height/thickness required to fill in an area about the semiconductor device 12 and between the polyimide layers 14, 16. The dielectric sheets 26 are formed from an organic material, such as a prepreg material, printed circuit board core material, polymeric resin, or other suitable adhesive, for example, that is either uncured or partially cured (i.e., B-stage), such that they can be easily stacked in their pre-cure film form. According to one embodiment of the invention, the dielectric sheet(s) 26 include openings/cut-outs 28 formed therein to receive the semiconductor device 12 therein and accommodate positioning of the sheet(s) 26 thereabout. Alternatively, it is recognized that segments of dielectric sheets 26 could be placed about the semiconductor device 12.

In order to fill-up empty gaps within the package structure 10, the dielectric sheet(s) 26 are subjected to a lamination process (typically in vacuum environment, at elevated temperature and under mechanical pressure) that causes the dielectric sheet(s) 26 to "melt" and flow. The dielectric sheet(s) 26 thus lose their film form and flow to fill up any empty air gaps around the semiconductor device 12 and between the polyimide layers 14, 16, such that a dielectric encapsulant 24 is provided that protects the semiconductor device 12 from the ambient environment in general.

As shown in FIG. 1, a plurality of vias 30 is formed through polyimide layer 14 down to a front surface 32 of the semiconductor device 12. In an embodiment where semiconductor device 12 is a power device, as in FIG. 1, vias 30 are also formed to back surface 34 of the semiconductor device 12 to meet electrical and thermal requirements (e.g., to make electrical connection that is needed and remove heat from the power semiconductor device). When electrical connection between the front and back surfaces is required, thru-vias 36 are also formed through polyimide layers 14, 16 and dielectric sheet(s) 26. Metal interconnects 38 are subsequently formed in the package structure 10 to provide electrical and thermal connections/pathways therein, with the interconnects 38 being formed in the vias 30, 36 and out onto the outward facing front and back surfaces 18, 20 of the polyimide layers 14, 16, respectively, such that both front and back surfaces 18, 20 of the package structure 10 include interconnects formed thereon. According to embodiments of the invention, the metal interconnects 38 comprise "POL interconnects" that are formed as robust electroplated copper interconnects that form direct electrical connections in the device 12. Depending on the metallization on the device, in some embodiments, a sputtered adhesion layer (titanium, chromium, etc.) is provided along with a sputtered copper seed layer on which copper can be plated. As shown in FIG. 1, the metal interconnects 38 are patterned and etched to a desired shape, such as to provide for electrical and thermal connections to package structure 10. According to one embodiment, metal interconnects 38 are patterned and etched to provide a large area thermal and electrical connection on the back side of package structure 10 (i.e., copper pad) that enables attachment of the package structure to a heatsink, for example.

A package structure 10 is thus provided having metal interconnects 38 on both sides of the structure. Due to its lamination process, the package structure 10 can completely embed the semiconductor device 12 and thus is surface mount technology (SMT)-compatible and may also provide for stacking of other electronics thereon. In an embodiment where semiconductor device 12 is a power device, the package structure 10 further provides double-sided cooling and eliminates the need for an additional multi-layer substrate (like a DBC substrate, etc.) that would typically be used for electrical and thermal functionality, as such a substrate is replaced entirely by thermal vias and large copper pads for heatspreading at the device backside. Such elimination of a multi-layer substrate in packaging a power device in the package structure 10 eliminates second-level assembly processes like soldering, underfilling (or over molding), etc., and enables a package structure 10 having a very small form-factor that is highly miniaturized.

Referring now to FIGS. 2-9, detailed views of the process steps for a technique of manufacturing a POL package structure are provided, according to an embodiment of the invention. The technique illustrated in FIGS. 2-9 is shown and described for manufacturing a package structure 10 as shown in FIG. 1 (i.e., including only a single semiconductor device), however, it is recognized that the described process is applicable to manufacturing package structures that embed multi-chip modules of various configurations.

Figure 2:
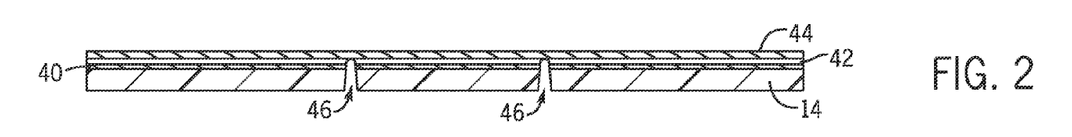
FIGS. 2-9 are schematic cross-sectional side views of a POL package structure during various stages of a manufacturing/build-up process according to an embodiment of the invention.

Referring to FIG. 2, the build-up process of package structure 10 begins with the providing of a pre-metalized dielectric layer. The pre-metalized dielectric layer includes a dielectric lamination or film 14 that is formed of one a plurality of dielectric materials, such as Kapton®, Ultem®, polytetrafluoroethylene (PTFE), Upilex®, polysulfone materials (e.g., Udel®, Radel®), or another polymer film, such as a liquid crystal polymer (LCP) or a polyimide material, according to embodiments of the invention—and is hereafter referred to as a polyimide film 14. A copper layer 40 is metalized on one surface of the polyimide film 14, with the copper layer 40 having a release layer 42 applied to a back surface thereof that secures an additional copper carrier layer 44 to the copper layer 40 to provide stability during the build-up process of the package structure 10. The release layer 42 allows for subsequent removal of the copper carrier layer 44 in a subsequent step of the manufacturing process.

Figure 3:
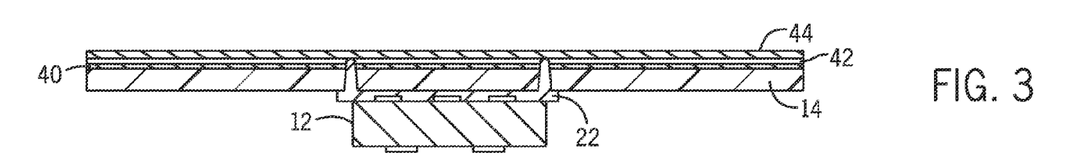

As further shown in FIG. 2, alignment marks 46 are laser drilled through the polyimide film 14 and into copper layer 40 to provide for placement of a semiconductor device (e.g., a die, MOSFET, etc.) 12 onto the pre-metalized dielectric layer. As shown in FIG. 3, an adhesive 22 is applied to the polyimide film 14 to secure semiconductor device 12 thereon, such as by a screen print application, dispensing, or a spin coat application. According to one embodiment of the invention, the adhesive 22 may be applied on the polyimide film 14 only at a location at which the semiconductor device 12 is to be placed. Alternatively, the adhesive 22 may be applied over an entirety of the polyimide film 14. Upon depositing of the adhesive 22 on polyimide film 14, the semiconductor device 12 is then placed on polyimide film 14 using the alignment marks 46 as a placement guide. The semiconductor device 12 is then secured to the polyimide film 14 by curing the adhesive 22.

Figure 4:
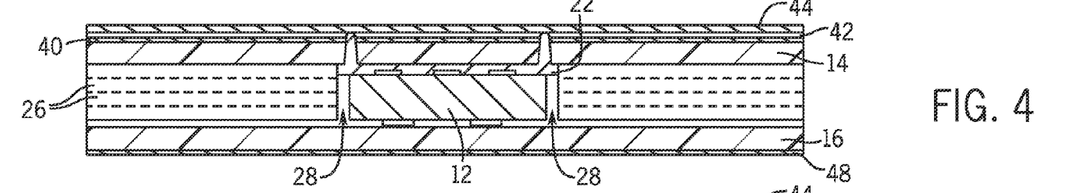

Referring now to FIG. 4, upon placement and securing of semiconductor device 12 on the pre-metalized dielectric layer 14, one or more dielectric sheets 26 are prepared and subsequently placed onto pre-metallized dielectric layer 14 and about semiconductor device 12, with the number of dielectric sheets 26 applied being determined based on a thickness of the semiconductor device 12. If a plurality of dielectric sheets 26 is required, the sheets are applied in a stacked arrangement in order to encapsulate the semiconductor device 12. The dielectric sheets 26 are formed from a organic material, such as a pre-preg material, PCB core material, polymeric resin, or other suitable adhesive that is in its pre-cure film form (such that they can be easily stacked), and are referred to hereafter generally as pre-preg sheets 26. In preparing the pre-preg sheets 26, films or panels of pre-preg material are provided and an opening 28 is formed (i.e., cut) therein corresponding to the location of semiconductor device 12. The prepared pre-preg sheets 26, with the opening 28 formed therein, are then stacked on one another to a desired height or thickness, such that they fully surround the semiconductor device 12. Upon stacking of the pre-preg sheets 26, a backside dielectric layer 16 (e.g., polyimide layer) is applied onto the stack of pre-preg sheets 26, with the backside polyimide film 16 comprising a pre-metalized layer. According to one embodiment of the invention, the backside polyimide film 16 can be pre-metalized so as to have a copper layer 48 of increased thickness for purposes of provided increased thermal functionality.

Figure 5:
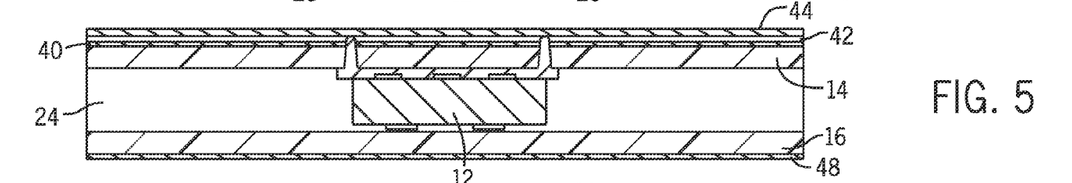

In a next step of the manufacturing process, and as shown in FIG. 5, a lamination process is performed in order to cause a melting and flowing of the pre-preg sheets 26. The lamination process may be performed in a vacuum environment, at an elevated temperature and under mechanical or air pressure, so as to cause the pre-preg sheets 26 to melt and thereby lose their film form. Upon melting, the pre-preg material that is provided between the polyimide films 14, 16 flows to fill-up empty air gaps around the semiconductor device 12 and within the package structure and thus can be described as forming an encapsulant 24. Upon cooling of the package structure 10, the pre-preg material becomes fully cured and can harden about the semiconductor device 12 to encapsulate the device.

Figure 6:
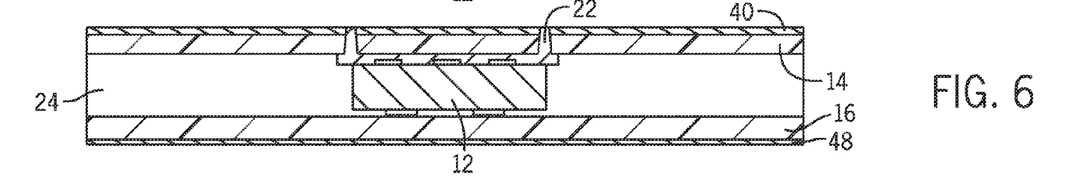
Figure 7:
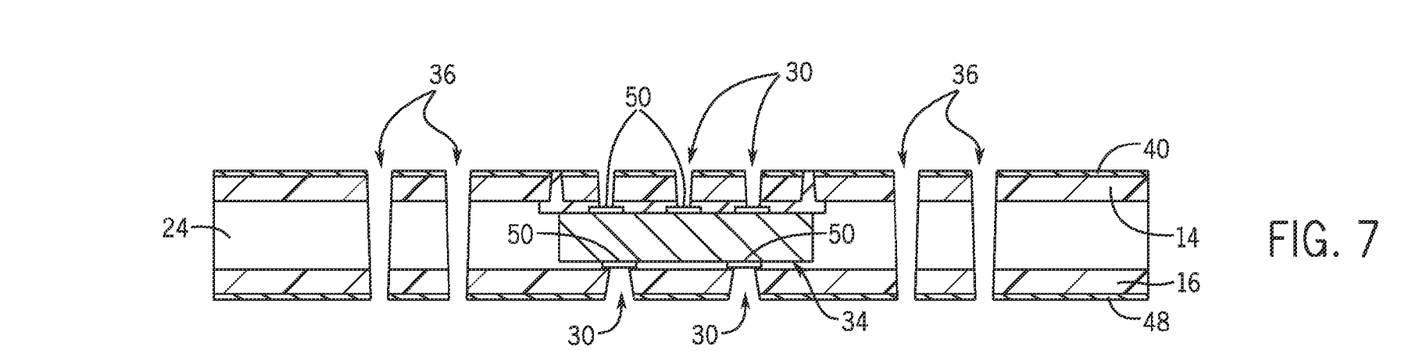

As shown in FIG. 6, upon completion of the lamination process, the copper carrier layer 44 is removed from copper layer 40 by way of release layer 42. The remaining copper layer 40 on polyimide film 14 is then cleaned in preparation for subsequent via formation and metallization steps. The formation of a plurality of vias 30 through polyimide film 14 and backside polyimide film 16 (i.e., polyimide film and copper layer) is shown in FIG. 7. According to embodiments of the invention, the vias 30 may be formed by way of a laser ablation or laser drilling process, plasma etching, photo-definition, or mechanical drilling processes. Vias 30 are formed down to contact pads 50 on the semiconductor device 12 (using an alignment drilling to see the die) for forming an electrical connection thereto and, in an embodiment where semiconductor device 12 is a power device (as is the case here), vias 30 are also formed to the backside 34 of the semiconductor device 12. The vias 30 down to contact pads 50 on the semiconductor device 12 are formed through polyimide film 14, and thus the features and preciseness of these vias 30 can be controlled within tight constraints. According to one embodiment, the vias 30 to the backside 34 of semiconductor device 12 are coarser features and cannot be formed with the same precision as the vias 30 to contact pads 50 (i.e., limits on line spacing and via diameters) due to their formation through the pre-preg encapsulant 24, which has fibers or other inclusions—although it is recognized that in some embodiments, vias 30 to the backside 34 of the device 12 may be formed only through polyimide film 16. In addition to the vias 30 formed down to semiconductor device 12, thru-vias 36 are drilled through the entire build-up (i.e., through polyimide films 14, 16 and pre-preg encapsulant 24).

Figure 8:
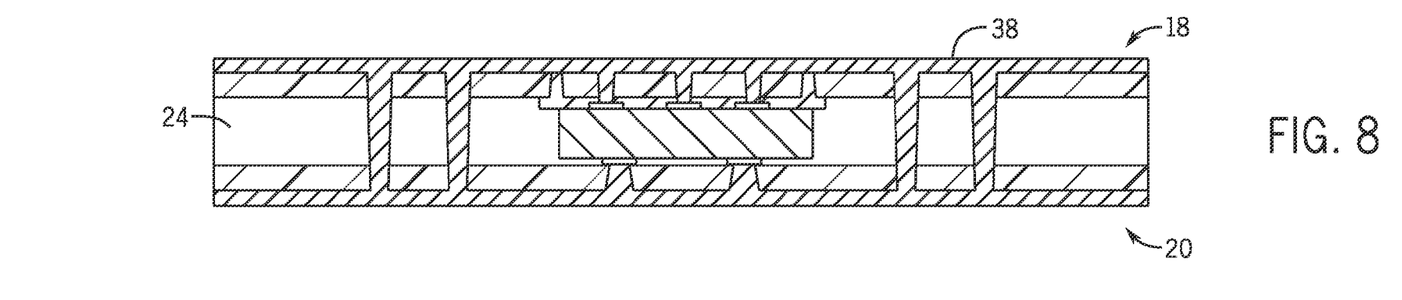
Figure 9:
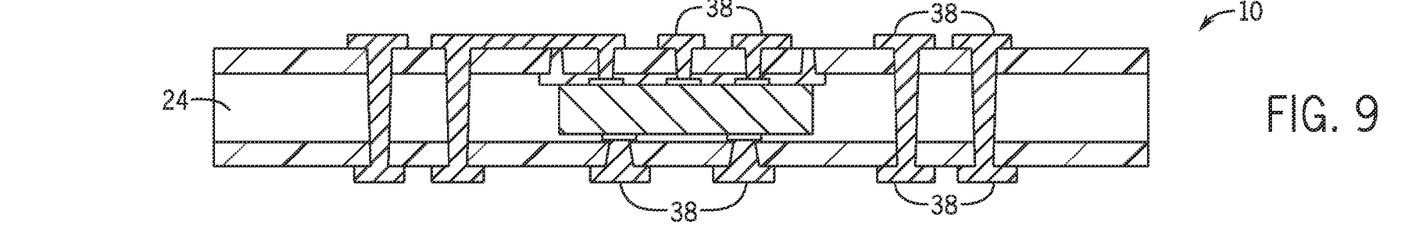

Once the vias 30, 36 have been formed down to semiconductor device 12 and through the package build-up, and upon completion of a cleaning of the vias (such as through a reactive ion etching (RIE) desoot process), if desired, metal interconnects 38 are then formed in the package structure, as shown in FIG. 8. The metal interconnects 38 are formed as POL interconnects that, according to one embodiment, are formed through an electroless plating or electrolytic plating, although it is recognized that other methods of metal deposition (e.g., sputtering) could also be used. For example, a titanium or palladium adhesion layer and copper seed layer may first be applied in vias 30, 36 by way of a sputtering or electroless plating process, followed by an electroplating process that fills the vias and increases a thickness of (i.e., "plating up") the copper to a desired level on both front and back surface 18, 20 of the package structure. As shown in FIG. 9, a patterning and etching is then subsequently performed on the applied copper to form POL interconnects 38 having a desired shape. While application of a continuous copper layer and subsequent patterning and etching of the continuous copper layer is shown in FIGS. 8 and 9 for forming interconnects 38, it is recognized that patterning and plating of the interconnects 38 via a semi-additive plating process could instead be employed to form the interconnects 38.

A completed package structure 10 is thus formed that provides interconnects on both sides of the structure. The package structure 10 is SMT-compatible and provides MSL-capability, mechanical robustness, double-sided cooling, and low material cost, all with a very small form-factor, so as to allow for production of a highly miniaturized package structure 10.

Referring now to FIGS. 10-16, detailed views of the process steps for another technique of manufacturing a POL package structure are provided, according to an additional embodiment of the invention. The technique illustrated in FIGS. 2-9 is again shown and described for manufacturing a package structure 10 as shown in FIG. 1 (i.e., including only a single semiconductor device), however, it is again recognized that the described process is applicable to manufacturing package structures that embed multi-chip modules of various configurations.

Figure 10:
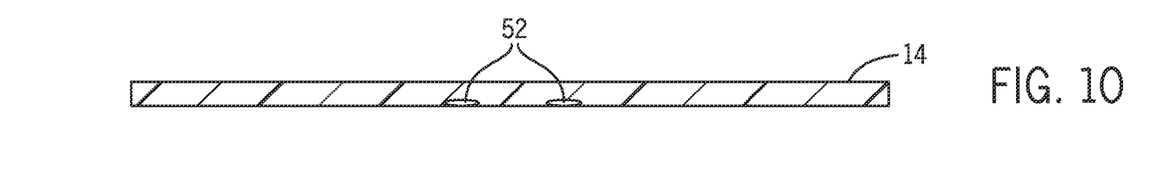
FIGS. 10-16 are schematic cross-sectional side views of a POL structure during various stages of another manufacturing/build-up process according to an embodiment of the invention.
Figure 11:
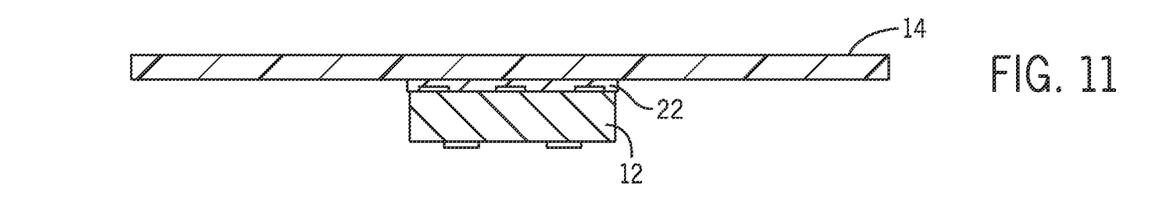

Referring to FIG. 10, the build-up process of the package structure begins with the providing of a dielectric layer 14, such as a polyimide lamination or film. Although not shown, polyimide film 14 may be placed on a frame or panel structure to provide stability during the build-up process of package structure. Alignment marks 52 are formed (through laser skiving or other method) into the polyimide film 14 to provide for a subsequent accurate placement of a semiconductor device (e.g., a die) onto the polyimide film. As shown in FIG. 11, an adhesive 22 is applied to the polyimide film 14 to secure a semiconductor device 12 thereon, such as by a screen print application, dispensing, or a spin coat application. According to one embodiment of the invention, the adhesive 22 may be applied on the polyimide film 14 only at a location at which the semiconductor device 12 is to be place. Alternatively, the adhesive 22 may be applied over an entirety of the polyimide film 14. Upon depositing of the adhesive 22 on polyimide film 14, the semiconductor device 12 is then placed on the polyimide film using the alignment marks 52 as a placement guide. The semiconductor device 12 is then secured to the polyimide film 14 by curing the adhesive 22.

Figure 12:
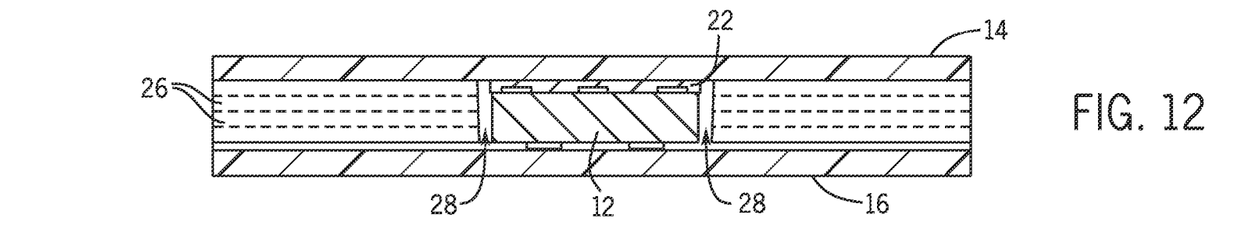

Referring now to FIG. 12, upon placement and securing of semiconductor device 12 on polyimide film 14, one or more dielectric sheets 26 are prepared and subsequently placed onto polyimide film 14 and about semiconductor device 12, with the number of dielectric sheets 26 applied being determined based on a thickness of the semiconductor device 12. If a plurality of dielectric sheets 26 is required, the sheets are provided in a stacked arrangement in order to encapsulate the semiconductor device 12. The sheets 26 are typically formed from a low moisture absorption organic material, such as a pre-preg material, PCB core material, polymeric resin, or other suitable adhesive that is in its pre-cure film form (such that they can be easily stacked), and are referred to hereafter generally as pre-preg sheets 26. In preparing the pre-preg sheets 26, films or panels of pre-preg material are provided and an opening 28 is formed (i.e., cut) therein corresponding to the location of semiconductor device 12. The prepared pre-preg sheets 26, with the opening 28 formed therein, are then stacked on one another to a desired height or thickness, such that they fully surround the semiconductor device 12. Upon stacking of the pre-preg sheets 26, a backside dielectric layer 16 (e.g., polyimide film) is applied onto the stack of pre-preg sheets 26. The polyimide layers/films 14, 16 can be used to provide good feature size control on both sides of the package and also provide structural balancing. In another embodiment, instead of a dielectric layer 16, a copper foil or film can be applied to prevent the pre-preg sheets 26 from sticking to a lamination press used to perform the lamination step/process, as will be explained in further detail later on.

Figure 13:
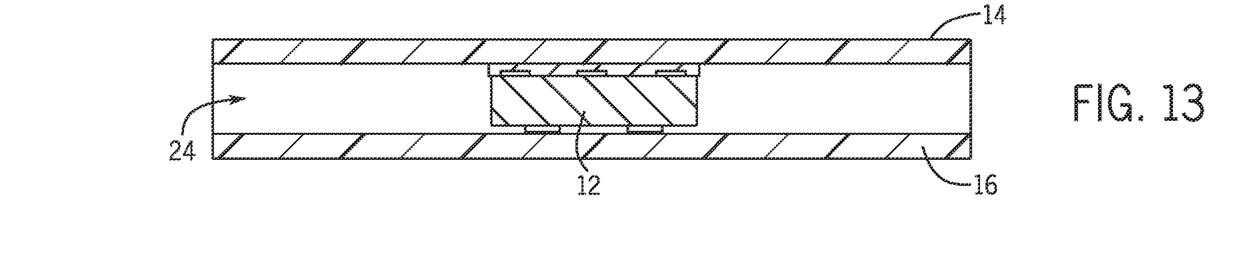

In a next step of the manufacturing process, and as shown in FIG. 13, a lamination process is performed in order to cause a melting and flowing of the pre-preg material into a continuous dielectric encapsulant 24. The lamination process may be performed in a vacuum environment, at an elevated temperature and under mechanical or air pressure, so as to cause the pre-preg sheets 26 to melt and thereby lose their film form and flow to fill up any empty air gaps around the semiconductor device 12. The pre-preg encapsulant is fully cured and can harden about the semiconductor device 12 to encapsulate the device.

Figures 14, 15:
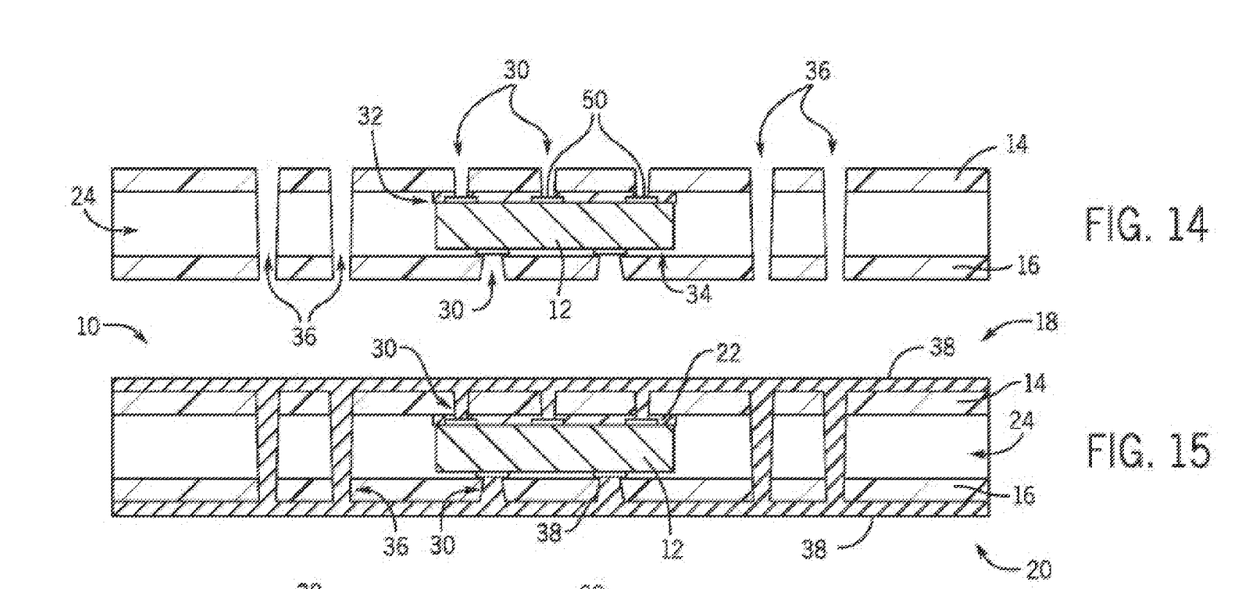

As shown in FIG. 14, upon completion of the lamination process, a plurality of vias 30 are formed through polyimide film 14 and backside polyimide film 16. According to embodiments of the invention, the vias 30 may be formed by way of a laser ablation or laser drilling process or mechanical drilling processes, with the vias 30 being aligned so as to be formed down to contact pads 50 on front side 32 of the semiconductor device 12 so as to form an electrical connection thereto. In the embodiment shown, vias 30 are also formed to the backside 34 of the semiconductor device 12 to remove heat from the device and/or make electrical connection as for a power device ( )—although it is recognized that such backside vias are not required in all embodiments and is dependent on the device. In addition to the vias 30 formed down to semiconductor device 12, thru-vias 36 are drilled through the entire build-up stack (i.e., through polyimide films 14, 16 and pre-preg encapsulant 24).

Figure 16:
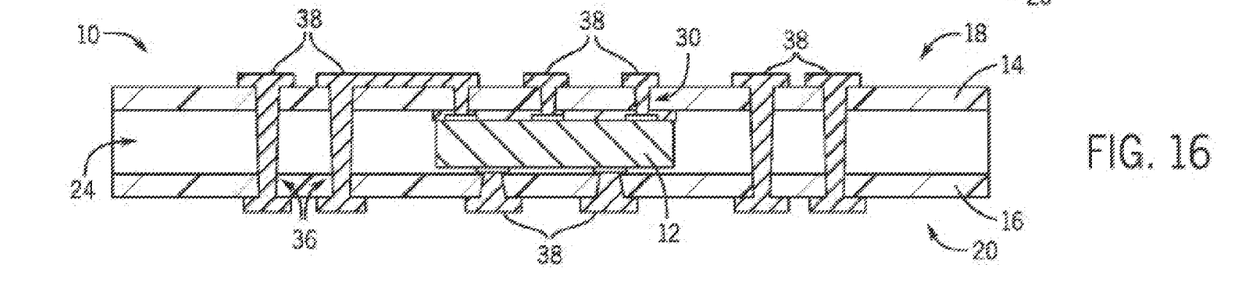

Once the vias 30, 36 have been formed down to semiconductor device 12 and through the encapsulant 24, POL metal interconnects 38 are then formed in the package structure, as shown in FIG. 15. According to one embodiment, the POL metal interconnects 38 may be formed through a combination of sputtering and electroplating applications, although it is recognized that other methods of metal deposition (e.g., electroless plating) could also be used. For example, a titanium or palladium adhesion layer and copper seed layer may first be applied in vias 30, 36 by way of sputtering, followed by an electroplating process that fills the vias and increases a thickness of (i.e., "plating up") the copper to a desired level on both front and back surface 18, 20 of the POL package structure. As shown in FIG. 16, a patterning and etching is then subsequently performed on the applied copper to form POL interconnects 38 having a desired size/shape. While application of a continuous copper layer and subsequent patterning and etching of the continuous copper layer is shown in FIGS. 15 and 16 for forming POL interconnects 38, it is recognized that patterning and plating of the POL interconnects via a semi-additive plating process could instead be employed to form the POL interconnects 38.

In each of the manufacturing processes set forth above in FIGS. 2-9 and 10-16, additional steps can be performed to form a multi-layer package structure. That is, using the package structure 10 as a "starting stack", additional layers of material can be applied to both outer surfaces of the structure 10. Thus, referring to FIG. 17, upon forming of the metal interconnects 38, additional layers 54, 56 are added to both sides of the package structure 10. According to one embodiment of the invention, the layers 54, 56 are formed of a printed circuit board (PCB) pre-preg material having a copper foil applied thereon that is laminated onto the polyimide layers 14, 16. According to another embodiment, the layers 54, 56 are formed of a polyimide material, with the layers 54, 56 being applied to polyimide layers 14, 16 via an adhesive 58 (shown in phantom). Vias 59 are then subsequently drilled in the added layers 54, 56, as shown in FIG. 18, with POL metal interconnects 38 being plated in the vias 59 and patterned on outer surfaces of the layers 54, 56.

Figure 18:
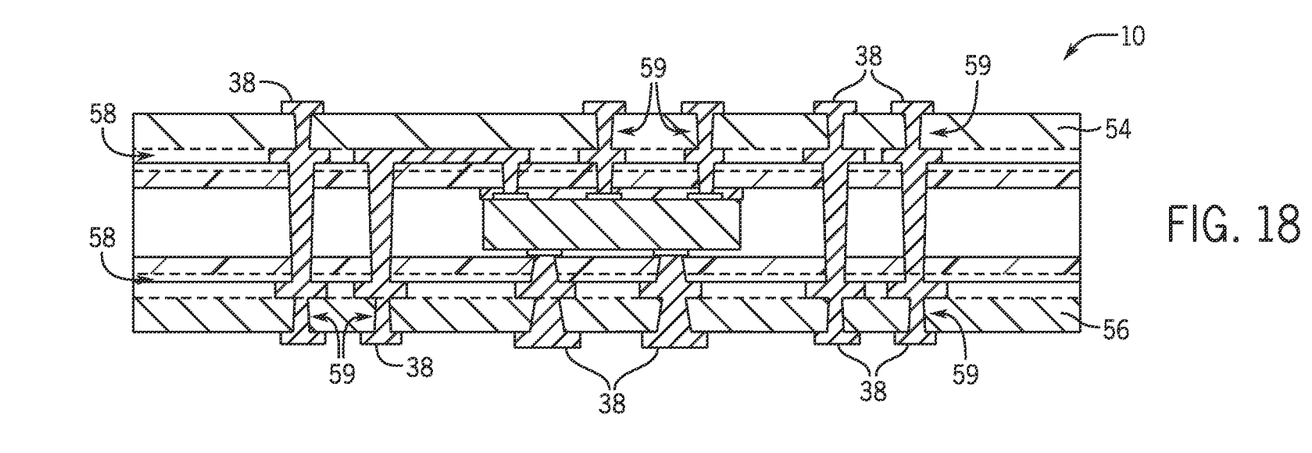
FIG. 18 is a schematic cross-sectional side view of the POL package structure of FIG. 17 illustrating an additional manufacturing/build-up step performed on the POL package structure according to another embodiment of the invention.

While not shown in FIG. 18, it is recognized that additional steps of the manufacturing process may be performed, such as applying a solder finish and soldermask over the patterned POL interconnects 38 and layers 54, 56 to provide a protective coating for the copper thereof. Alternative to solder, it is recognized that the solder mask exposed copper pads could be left terminated with a metallization of Ni or Ni/Au or organic solderability protection (OSP) layer. Second-level I/O interconnections may then be applied to the pads that are exposed by openings in the soldermask. In one embodiment, I/O interconnection pads are left terminated with a solderable finish to form Land Grid Arrays (LGAs) or bumped with solder to form Ball Grid Array (BGA) solder bumps t to enable surface mounting of the package structure to an external circuit, for example, with the solder bumps providing a highly reliable second-level interconnection structure that is resistive to failure in high stress conditions.

Figure 19:
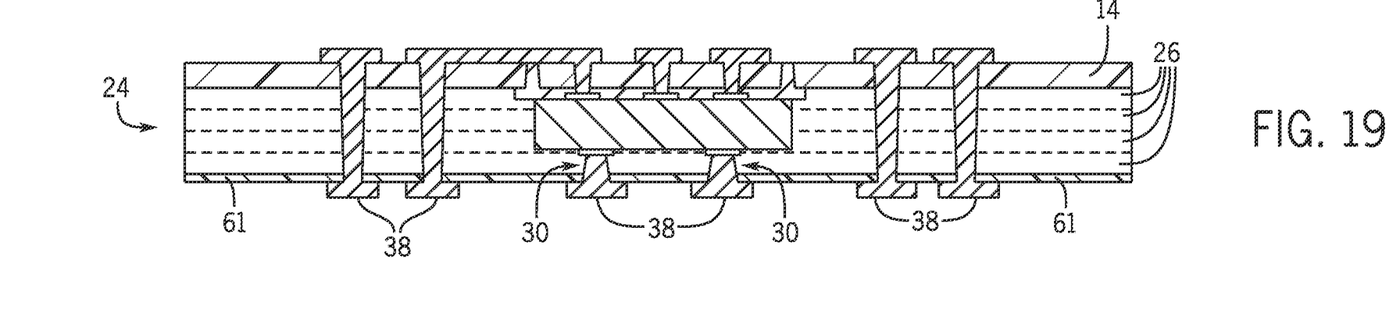
FIG. 19 is a schematic cross-sectional side view of a POL package structure according to another embodiment of the invention.

In each of the manufacturing processes set forth above in FIGS. 2-9 and 10-16, it is recognized that—instead of applying second polyimide layer 16 to encapsulant 24, i.e., the stack of pre-preg sheets 26—a copper foil or film could be applied to the pre-preg sheets. That is, a copper foil can be substituted for the polyimide layer 16, as the copper foil functions similarly thereto regarding preventing the pre-preg layers 26 from sticking to stick to the laminator surfaces. An embodiment where a copper foil 61 is implemented in a package structure is illustrated in FIG. 19. In implementing the copper foil 61, it is recognized that the copper traces (i.e., metallic interconnects 38) will be formed in this copper on the pre-preg material 26 rather than being formed on a polyimide layer 16. In doing so, vias 30 would first be formed through the copper foil 61, and POL metal interconnects 38 would then be formed thereon through a combination of sputtering and electroplating applications, with either a continuous copper layer application and subsequent patterning and etching being performed or a semi-additive plating process being performed to form the POL interconnects 38.

Referring now to FIGS. 20-23, additional embodiments of POL package structures for packaging semiconductor devices are shown. Each of the POL package structure embodiments shown in FIGS. 20-23 have a similar structure to the package structure 10 shown and described in FIG. 1 in that they completely embed the semiconductor device(s) via the use of one or more dielectric sheets that may be stacked and positioned about the semiconductor devices and subsequently cured to melt/flow thereabout, with interconnects being formed on both sides of the package structure to provide all electrical (and thermal) connections to the semiconductor device(s) therein.

Figure 20:
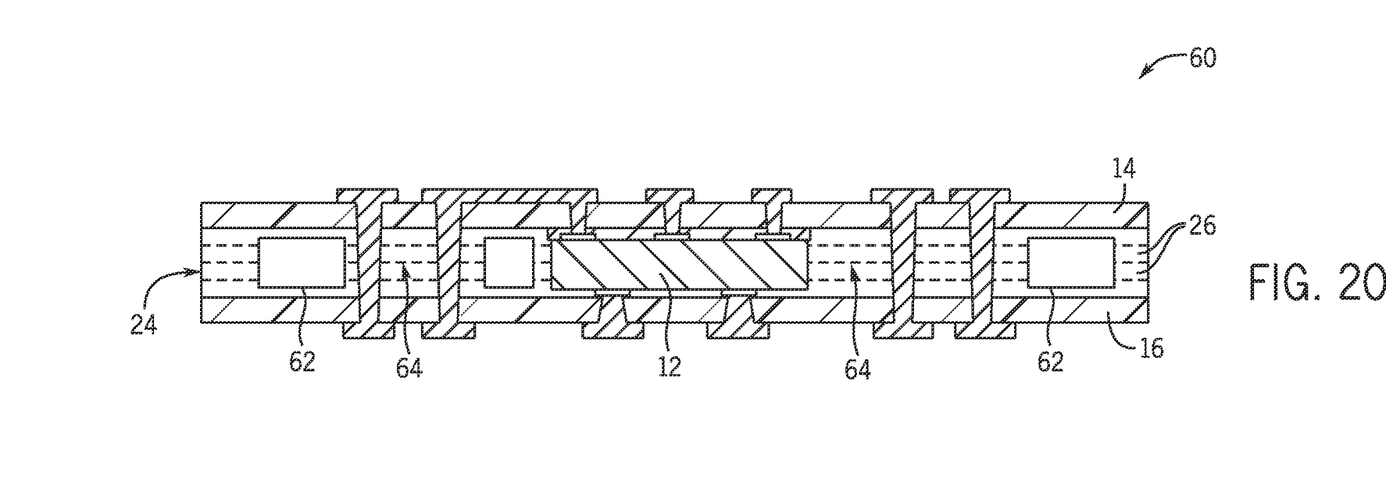
FIG. 20 is a schematic cross-sectional side view of a POL package structure according to another embodiment of the invention.

Referring first to FIG. 20, a package structure 60 is shown according to another embodiment of the invention. The package structure 60 is very similar to the package structure 10 of FIG. 1, except that package structure 60 includes a dielectric web material 62, termed here as a "POL web," that is positioned about the semiconductor device 12. According to embodiments of the invention, the POL web 62 is formed of a printed circuit board (PCB) core material, polyimide film/layer, a ceramic material, a composite dielectric material, or other similar/suitable organic material that exhibits low moisture absorption properties and provides mechanical robustness to the POL structure (i.e., dielectric web 62 is constructed to have an increased rigidity as compared to dielectric sheets 26) and that does not reflow during the lamination of the package structure 60. According to one embodiment, the POL web 62 may also include copper circuitry therein. Additionally, based on the material from which it is formed, the POL web 62 does not flow during the lamination process. The POL web 62 is formed to include openings/cutouts 64 therein to accommodate the semiconductor device(s) 12 and thru-vias 36, with the POL web 62 having a suitable thickness. As further shown in FIG. 20, the POL web 62 is combined with encapsulant 24 to fully embed the semiconductor device 12 within the package structure 60. As previously described with respect to FIG. 1, the dielectric encapsulant 24 is provided as one or more sheets of uncured dielectric material 26 (e.g., pre-preg material, polymeric resin, etc.). The sheets 26 are positioned in empty gaps between the POL web 62 and the semiconductor device 12 on the polyimide layer 14, with the package structure 60 being subjected to a lamination process in order to cause a melting of the dielectric sheets 26, thereby causing the sheets to lose their film form and flow to fill up any empty air gaps around the semiconductor device 12 and dielectric web 62.

Figure 21:
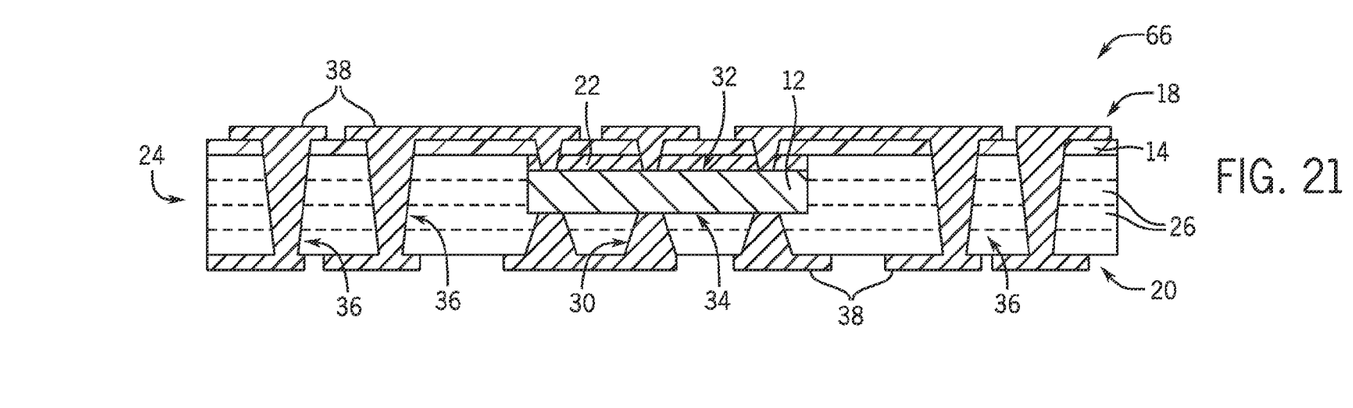
FIG. 21 is a schematic cross-sectional side view of a POL package structure according to another embodiment of the invention.

Referring now to FIG. 21, a POL package structure 66 is shown according to another embodiment of the invention. The package structure 66 is very similar to the package structure 10 of FIG. 1, except that package structure 66 does not include a layer of dielectric material positioned on the dielectric encapsulant 24 on a side opposite from layer 14 that does not melt and flow during lamination (e.g., polyimide layer), such as layer 16 (i.e., polyimide layer 16) in the package structure 10 of FIG. 1. Thus, in package structure 66, polyimide layer 14 is provided on front surface 18 of the package structure 10, while the dielectric encapsulant 24 forms the back surface 20 of the package structure 66. The semiconductor device 12 is positioned on polyimide layer 14 and affixed thereto by way of an adhesive 22, with dielectric encapsulant 24 being deposited on polyimide layer 14 so as to encompass device 12. As set forth in detail above, the encapsulant 24 is comprised of one or more dielectric sheets 26 formed from an organic material (e.g., pre-preg material, PCB core material, polymeric resin, or other suitable adhesive, for example) that is either uncured or partially cured (i.e., B-stage), with the sheets being applied onto polyimide layer 14 in a 'film' or 'panel' form, such that, if required, multiple dielectric sheets 26 can be stacked on one another to a required height/thickness required to fill in an area about the semiconductor device 12. The dielectric sheet(s) 26 are subjected to a lamination process that causes the dielectric sheet(s) 26 to melt and lose their film form to flow and fill up any empty air gaps around the semiconductor device 12.

As shown in FIG. 21, a plurality of vias 30 is formed through polyimide layer 14 down to a front surface 32 of the semiconductor device 12. Vias 30 are also formed through the encapsulant 24 to back surface 34 of the semiconductor device 12 to meet electrical and thermal requirements (e.g., when device 12 is a power semiconductor device). Thru-vias 36 are also formed through polyimide layer 14 and dielectric sheet(s) 26. POL metal interconnects 38 are subsequently formed in the package structure 66 to provide electrical and thermal connections/pathways therein, with the interconnects 38 being formed in the vias 30, 36 and out onto the front and back surfaces 18, 20 of the package structure 66.

While not shown in FIG. 21, it is recognized that the package structure 66 could further include a POL web structure therein (e.g., POL web 62 in FIG. 20) that is positioned about the semiconductor device 12 and within encapsulant 24 to provide stability to the POL structure. The POL web would be formed of a printed circuit board (PCB) core material, polyimide film/layer, a ceramic material, or a composite dielectric material—such that the POL web structure does not flow during the lamination process of the package structure 66.

Figure 17:
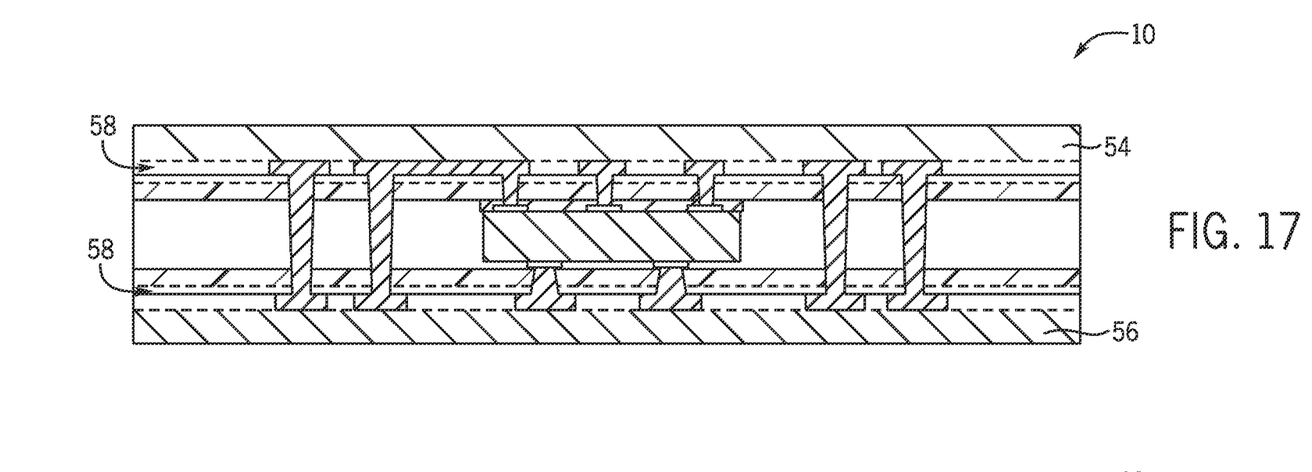
FIG. 17 is a schematic cross-sectional side view of the POL package structure formed by the manufacturing/build-up process of FIGS. 2-9 or FIGS. 10-16 illustrating an additional manufacturing/build-up step performed on the POL package structure according to another embodiment of the invention.
Figure 22:
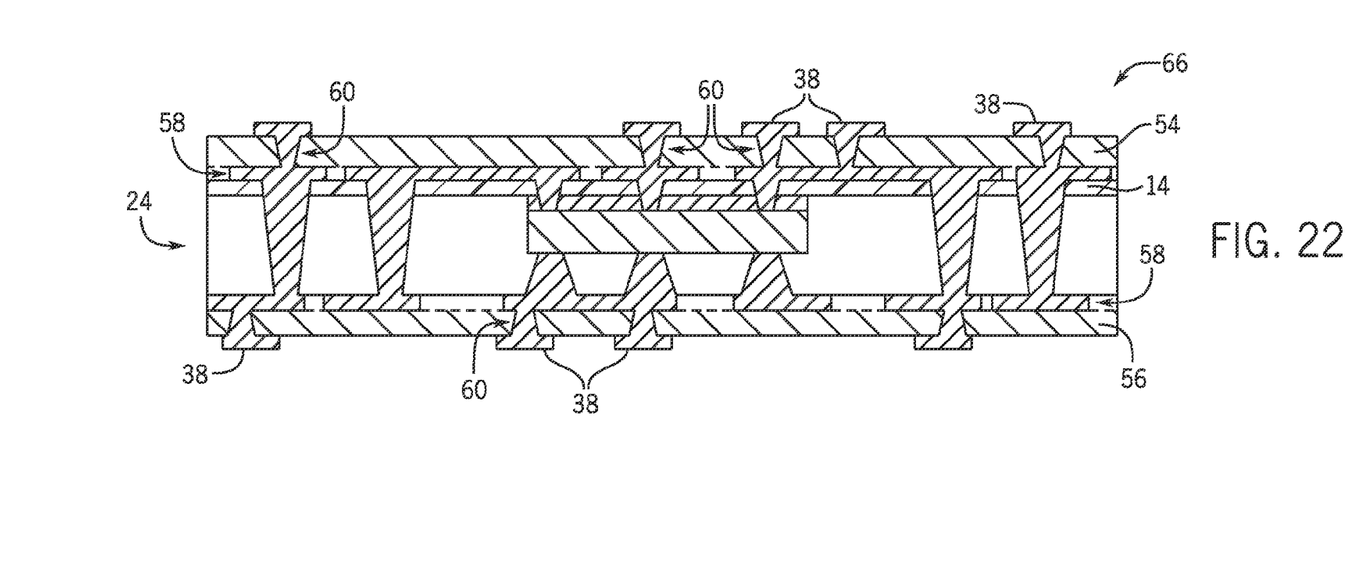
FIG. 22 is a schematic cross-sectional side view of a POL package structure according to another embodiment of the invention.

According to one embodiment, the package structure 66 can act as a "starting stack" to which additional layers of material can be applied, similar to the package structure 10 shown in FIG. 17. That is, upon forming of the metal interconnects 38 in package structure 66, additional layers 54, 56 are added to both sides of the package structure 66, as is illustrated in FIG. 22. According to one embodiment of the invention, the layers 54, 56 are formed of a printed circuit board (PCB) pre-preg material with a copper foil thereon that is laminated onto the polyimide layers 14, 16. According to another embodiment, the layers 54, 56 are formed of a polyimide material, with the layers 54, 56 being applied to polyimide layers 14, 16 via an adhesive 58 (shown in phantom). Vias 60 are then subsequently drilled in the added layers 54, 56, as shown in FIG. 18, with metal interconnects 38 being plated in the vias 60 and patterned on outer surfaces of the layers 54, 56.

Figure 23:
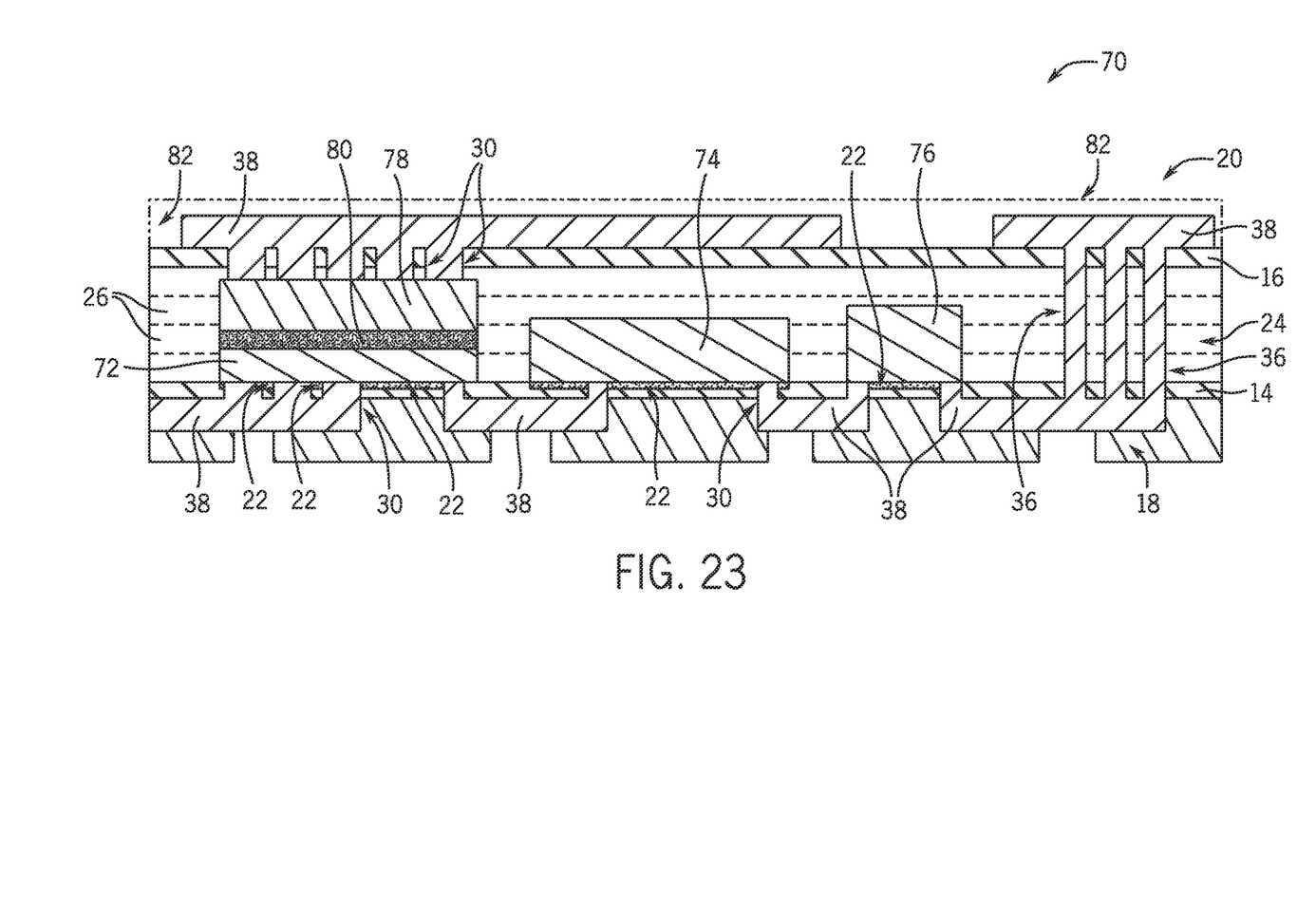
FIG. 23 is a schematic cross-sectional side view of a POL package structure according to another embodiment of the invention.

Referring now to FIG. 23, a package structure 70 is shown according to another embodiment of the invention, where a power module having multiple electronic components is packaged. The package structure 70 includes a plurality of electronic components therein in the form of power devices, control circuits, and/or passive devices, with a power semiconductor device 72 (e.g., die, diode, MOSFET), gate driver 74, and passive device 76 being shown in FIG. 22, although it is recognized that a greater or lesser number of electronic devices/components could be included in POL structure 70. Additionally, according to one embodiment, a copper shim 78 is optionally included and attached to a backside 22 of semiconductor device 72 (by way of a solder 80, for example), although it is recognized that—absent shim 78—vias 30 could instead be extended to the back surface of device 72 (i.e., drill taller vias) to make up the height differences.

As shown in FIG. 23, polyimide layers 14, 16 are provided on both sides of the package structure 70 so as to provide the ability to form POL vias and patterned POL metal interconnects on both surfaces. The electronic components 72, 74, 76 are positioned between the polyimide layers 14, 16, with the electronic components 72, 74, 76 being attached to the polyimide layer 14 by way of adhesive 22. A dielectric encapsulant 24 is provided between the polyimide layers 14, 16 that is comprised of one or more dielectric sheets 26 that are provided in a 'film' or 'panel' form, such that multiple dielectric sheets 26 can be stacked on one another to a required height/thickness required to fill in an area about the semiconductor device 72, gate driver 74, and passive device 76. The dielectric sheet(s) 26 are subjected to a lamination process that causes the dielectric sheet(s) 26 to melt and lose their film form to flow and fill up any empty air gaps around the electronic components 72, 74, 76 and between the polyimide layers 14, 16, as previously described. Although not shown, it is recognized that a POL web structure (e.g., web 62 in FIG. 20) could be positioned with encapsulant 24 about the semiconductor device 12 to provide stability to the POL structure, with the POL web structure being formed of a material that does not flow during the lamination process.

As shown in FIG. 23, a plurality of vias 30 is formed through polyimide layer 14 down to electronic components 72, 74, 76. Vias 30 are also formed through polyimide layer 16 to shim 78 on the back surface of the semiconductor device 72. Thru-vias 36 are also formed through polyimide layers 14, 16 and dielectric sheet(s) 26. Metal interconnects 38 are subsequently formed in the package structure 70 to provide electrical and thermal connections/pathways therein. As shown in FIG. 23, the POL interconnects 38 are patterned and etched to a desired shape, such as to provide for electrical connections on the front side 18 of the package structure 70 and to provide a large area electrical and thermal connection on the back side 20 of package structure 70 that enables attachment of the structure to a heatsink or to a system I/O, for example.

According to one embodiment of the invention, and as shown in phantom in FIG. 23, the package structure 70 can be further processed, such as by adding thermal interface material(s) (TIM) 82 to the backside 20 of the structure (i.e., onto dielectric layer 16). That is, a layer of compliant TIM 82 having a thermal conductivity is applied onto the POL structure 70 and over the POL interconnects 38 that form the large copper pads on the backside 20 of the package structure. Examples of suitable TIMs include, without limitation, adhesives, greases, gels, pads, films, liquid metals, compressible metals, and phase change materials. Liquid metal TIMs, for example, are typically indium-gallium alloys that are in liquid state over temperatures typically encountered in power electronics applications. Compressible metals are sufficiently soft to make intimate contact between a heatsink and POL mating surfaces and may include, for example, indium. In this manner, a heat sink (not shown) may be thermally bonded to the POL structure 70 without the use of brazing or metallurgical bonding the heat sink(s) directly to the POL structure 70 or without the need to planarize the POL structure 70 prior to bonding the POL structure to the heat sink(s).

In FIG. 23, a package structure 70 is thus provided having POL interconnects 38 on both sides of the package structure. Due to its lamination process, the package structure 70 can completely embed all the electrical components 72, 74, 76 and thus is surface mount technology (SMT)-compatible and provides double-sided cooling. The double-sided package structure 70 eliminates the need for an additional multi-layer substrate (like a DBC substrate, etc.) in the power module that would typically be used for electrical and thermal functionality, as such a substrate is replaced entirely by POL vias and large copper pads for electrical connection and heatspreading at the device backside. The elimination of the multi-layer substrate in the package structure 70 eliminates second-level assembly processes like soldering, underfilling (or over molding), etc. The resulting package structure 70 thus has a very small form-factor and is highly miniaturized.

Therefore, according to one embodiment of the invention, a package structure includes a first dielectric layer, at least one semiconductor device attached to the first dielectric layer, one or more dielectric sheets applied to the first dielectric layer and about the at least one semiconductor device so as to embed the at least one semiconductor device therein, and a plurality of vias formed to the at least one semiconductor device, the plurality of vias formed in at least one of the first dielectric layer and the one or more dielectric sheets. The package structure also includes metal interconnects formed in the plurality of vias and on one or more outward facing surfaces of the package structure to form electrical interconnections to the at least one semiconductor device. The first dielectric layer is composed of a material that does not flow during a lamination process and each of the one or more dielectric sheets is composed of a curable material configured to melt and flow when cured during the lamination process, such that the one or more dielectric sheets melt and flow to fill-in any air gaps present around the at least one semiconductor device.

According to another embodiment of the invention, a method of manufacturing a semiconductor device package structure includes attaching at least one semiconductor device to a first dielectric layer by way of an adhesive, forming one or more dielectric sheets of a curable material configured to melt and flow when cured, with each of the dielectric sheets being in an uncured or partially cured state, applying the one or more dielectric sheets on the first dielectric layer so as to be positioned about the at least one semiconductor device, applying a copper foil on the outer surface of the last dielectric sheet, and curing the one or more dielectric sheets to cause the one or more dielectric sheets to melt and flow into any air gaps present around the at least one semiconductor device and so as to embed the at least one semiconductor device therein, wherein the first dielectric layer does not flow during the curing of the one or more dielectric sheets. The method also includes forming a plurality of vias to the at least one semiconductor device, the plurality of vias being formed in at least one of the first layer and the one or more dielectric sheets, and forming metallic interconnects in the plurality of vias and over at least a portion of one or more outer surfaces of the package structure, the metallic interconnects forming electrical interconnections to the at least one semiconductor device.

According to yet another embodiment of the invention, a POL package structure includes a first dielectric layer having an adhesive applied on at least a portion thereof, one or more semiconductor devices attached to the first dielectric layer by way of the adhesive with a surface of each of the one or more semiconductor devices having contact pads thereon being attached to the first dielectric layer, and a dielectric encapsulant positioned on the first dielectric layer about the one or more semiconductor devices so as to embed the one or more semiconductor devices therein, the dielectric encapsulant comprising one or more uncured or partially cured dielectric sheets configured to melt and flow when cured so as to fill-in any air gaps present around the one or more semiconductor devices. The POL package structure also includes a plurality of vias formed to the one or more semiconductor devices and in at least one of the first dielectric layer and the dielectric encapsulant and POL interconnects formed in the plurality of vias to form all electrical and thermal interconnections to the one or more semiconductor devices and in the POL package structure. The first dielectric is configured to not flow during the curing of the one or more dielectric sheets.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A package structure comprising:
    a first dielectric layer;
    at least one semiconductor device attached to the first dielectric layer, with each of the at least one semiconductor devices having a front surface attached to the first dielectric layer, the front surface comprising contact pads thereon that provide an electrical connection to the semiconductor device;
    one or more dielectric sheets applied to the first dielectric layer and about the at least one semiconductor device so as to embed the at least one semiconductor device therein;
    a plurality of vias formed to the at least one semiconductor device, with at least a portion of the plurality of vias being formed through the first dielectric layer to the contact pads on the front surface of the power semiconductor device; and
    metal interconnects formed in the plurality of vias and on one or more outward facing surfaces of the package structure to form electrical interconnections to the at least one semiconductor device;
    wherein the first dielectric layer is composed of a material that does not flow during a lamination process;
    wherein each of the one or more dielectric sheets is composed of a curable material that melts and flows when cured during the lamination process, such that the one or more dielectric sheets melt and flow to fill-in any air gaps present around the at least one semiconductor device.

2. The package structure of claim 1 further comprising a dielectric web positioned about the at least one semiconductor device, with the dielectric web including one or more openings formed therein to receive the at least one semiconductor device.

3. The package structure of claim 2 wherein the dielectric web is constructed to have an increased rigidity as compared to the dielectric sheets and to not flow during a lamination process, with the dielectric web being composed of one of a printed circuit board (PCB) core material, polyimide layer, a ceramic material, and a composite dielectric material.

4. The package structure of claim 2 wherein the dielectric web is constructed to have copper circuitry therein.

5. The package structure of claim 1 wherein the one or more dielectric sheets are composed of one of a pre-preg material, a polymeric resin, or an adhesive, in an uncured or partially cured state.

6. The package structure of claim 1 wherein the at least one semiconductor device comprises a power semiconductor device.

7. The package structure of claim 6 wherein the plurality of vias comprises:
    vias formed through the one or more dielectric sheets to a back surface of the power semiconductor device;
    wherein the vias function as thermal and electrical vias in the package structure; and
    wherein metal interconnects are formed in each of the vias to the front and back surfaces of the power semiconductor device.

8. The package structure of claim 7 wherein the metal interconnects comprise plated copper power overlay (POL) interconnects forming electrical connections and a heat spreading copper pad on the outward facing surfaces of the package structure, so as to provide electrical and thermal interconnections to the power semiconductor device.

9. The package structure of claim 8 further comprising a thermal interface material (TIM) applied onto an outward facing surface of the package structure and over the heat spreading copper pad, so as to enable bonding of the package structure to a heatsink.

10. The package structure of claim 1 further comprising a plurality of thru-vias extending through the first dielectric layer and the one or more dielectric sheets, and wherein metal interconnects are formed in each of the thru-vias to the front and back surfaces of the at least one semiconductor device.

11. The package structure of claim 1 further comprising a second dielectric layer positioned on an outward facing surface of the package structure opposite the first dielectric layer, with the one or more dielectric sheets and the at least one semiconductor device being positioned between the first dielectric layer and the second dielectric layer, and where the second dielectric layer is composed of a material that does not flow during a lamination process.

12. The package structure of claim 1 further comprising a copper foil positioned on an outward facing surface of the package structure opposite the first dielectric layer, with the one or more dielectric sheets and the at least one semiconductor device being positioned between the first dielectric layer and the copper foil.

13. The package structure of claim 1 further comprising:
    a layer of one of a PCB pre-preg material or a polyimide material attached to the outward facing surfaces of the package structure, so as to form a multi-layer package structure;
    a plurality of vias formed through each of the layers of the PCB prepreg material or polyimide material; and
    metal interconnects formed in the plurality of vias in the layers of the PCB prepreg material or polyimide material.

14. A power overlay (POL) package structure comprising:
    a first dielectric layer having an adhesive applied on at least a portion thereof;
    one or more semiconductor devices attached to the first dielectric layer by way of the adhesive, with a surface of each of the one or more semiconductor devices having contact pads thereon being attached to the first dielectric layer;
    a dielectric encapsulant positioned on the first dielectric layer about the one or more semiconductor devices so as to embed the one or more semiconductor devices therein, the dielectric encapsulant comprising one or more uncured or partially cured dielectric sheets configured to melt and flow when cured so as to fill-in any air gaps present around the one or more semiconductor devices;
    a second dielectric layer positioned on an outward facing surface of the package structure opposite the first dielectric layer and configured to not flow during the curing of the one or more dielectric sheets, with the dielectric encapsulant and the at least one semiconductor device being positioned between the first dielectric layer and the second dielectric layer;

a plurality of vias formed to the one or more semiconductor devices, the plurality of vias formed in at least one of the first dielectric layer and the dielectric encapsulant; and POL interconnects formed in the plurality of vias to form all electrical and thermal interconnections to the one or more semiconductor devices and in the POL package structure;

wherein the first dielectric is configured to not flow during the curing of the one or more dielectric sheets.

15. The power module package structure of claim 14 further comprising a dielectric web positioned on the first dielectric layer and about the one or more semiconductor devices, with the dielectric web including openings formed therein to receive the one or more semiconductor devices therein;

wherein the dielectric web is constructed to have an increased rigidity as compared to the one or more dielectric sheets and is composed of a material that does not melt or flow when subjected to a dielectric encapsulant curing process.

16. The power module package structure of claim 14 wherein the plurality of dielectric sheets are composed of one of a pre-preg material, a polymeric resin, or an adhesive.

17. A package structure comprising:
a first dielectric layer;
at least one semiconductor device attached to the first dielectric layer;
a plurality of dielectric sheets applied to the first dielectric layer and about the at least one semiconductor device in a stacked arrangement so as to embed the at least one semiconductor device therein;

a plurality of vias formed to the at least one semiconductor device, the plurality of vias formed in at least one of the first dielectric layer and the plurality of dielectric sheets; and metal interconnects formed in the plurality of vias and on one or more outward facing surfaces of the package structure to form electrical interconnections to the at least one semiconductor device;

wherein at least one of the plurality of dielectric sheets includes one or more openings formed therein to receive respective semiconductor devices of the at least one semiconductor device therein.

18. The package structure of claim 17 wherein the first dielectric layer is composed of a material that does not flow during a lamination process, and wherein each of the plurality of dielectric sheets is composed of a curable material configured to melt and flow when cured during the lamination process, such that the plurality of dielectric sheets melt and flow to fill-in any air gaps present around the at least one semiconductor device.

19. The package structure of claim 17 further comprising a dielectric web positioned about the at least one semiconductor device, with the dielectric web including one or more openings formed therein to receive the at least one semiconductor device.

* * * * *